United States Patent [19]

Burnham et al.

[11] 4,302,729
[45] Nov. 24, 1981

[54] CHANNELED SUBSTRATE LASER WITH DISTRIBUTED FEEDBACK

[75] Inventors: Robert D. Burnham, Los Altos Hills; Donald R. Scifres, Los Altos; William Streifer, Palo Alto, all of Calif.

[73] Assignee: Xerox Corporation, Stamford, Conn.

[21] Appl. No.: 39,424

[22] Filed: May 15, 1979

[51] Int. Cl.³ .............................................. H01S 3/19
[52] U.S. Cl. ............................................ 331/94.5 H
[58] Field of Search ..................... 331/94.5 H; 357/18

[56] References Cited

U.S. PATENT DOCUMENTS 4,190,813  2/1980  Logan et al. ................. 331/94.5 H
4,257,011  3/1981  Nakamura et al. ............ 331/94.5 H

FOREIGN PATENT DOCUMENTS 557  2/1979  European Pat. Off. ....... 331/94.5 H

OTHER PUBLICATIONS

Kuroda et al., "Channeled-substrate-planar structure distributed-feedback semiconductor lasers", *Appl. Phys. Lett.*, vol. 33, No. 2, 7/15/78, pp. 173-174.

*Primary Examiner*—James W. Davie
*Attorney, Agent, or Firm*—Leonard Zalman

[57] ABSTRACT

A solid state laser in which transverse mode control is achieved by a layer of non-uniform thickness adjacent the laser active region and longitudinal mode control is achieved by a periodic structure formed in the laser substrate. The layer of non-uniform thickness is provided by forming the layer on a channeled substrate, and the teeth of the periodic structure extend in a direction transverse to the direction of the channel.

1 Claim, 3 Drawing Figures

CHANNELED SUBSTRATE LASER WITH DISTRIBUTED FEEDBACK

BACKGROUND OF THE INVENTION

For many applications it is desirable to control both the transverse modes and longitudinal modes of the light generated by a semiconductor diode laser such that the output emission of the laser contains only a single longitudinal mode and a single transverse mode. An output emission containing only a single transverse mode is easy to focus, and has a substantially linear power output versus pump current relationship which is desirable for systems applications such as optical disk recording.

An output emission containing only a single longitudinal mode has a single frequency which could find applications in communications links using frequency multiplexing over fiber optic cables, holography, and in the production of visible light by harmonic generation.

In addition, an output emission containing only a single longitudinal mode and a single transverse mode from a laser having no end mirrors is desirable since the output can be coupled directly into a waveguide or other structure forming a part of an integrated optic system.

SUMMARY OF THE INVENTION

In accordance with the invention, a solid state guided wave diode laser having an output emission containing only a single longitudinal mode and a single transverse mode is provided by a laser substrate which contains (1) a surface channel along the direction of the output emission, and (2) a periodic structure adjacent at least one side of the channel and having teeth extending in a direction transverse to the direction of the output emission. The channeled surface of the substrate is separated from the laser active region by a semiconductor layer having a non-uniform thickness (due to the channel) in a direction perpendicular to the output emission and of a material having a bandgap higher than that of the substrate material and the active region material. Another layer of a material having a bandgap higher than that of the material of the active region can be provided on the non-substrate side of the active region so that the optical density of the laser is guided by the double heterostructure waveguide. The layer of non-uniform thickness permits attenuation of the higher order transverse modes of the guided wave by the substrate more than it permits attenuation of the lowest order transverse mode of the guided wave by the substrate whereby single, lowest order transverse mode operation is achieved. Longitudinal mode control is achieved by optical interaction of the edges of the guided wave with the periodic structure, the period of the periodic structure significantly determining the particular longitudinal mode emitted.

DESCRIPTION OF THE DRAWINGS

A specific embodiment of the invention is described in detail below with reference to the drawings, in which.

DETAILED DESCRIPTION OF THE INVENTION

Figure 1:
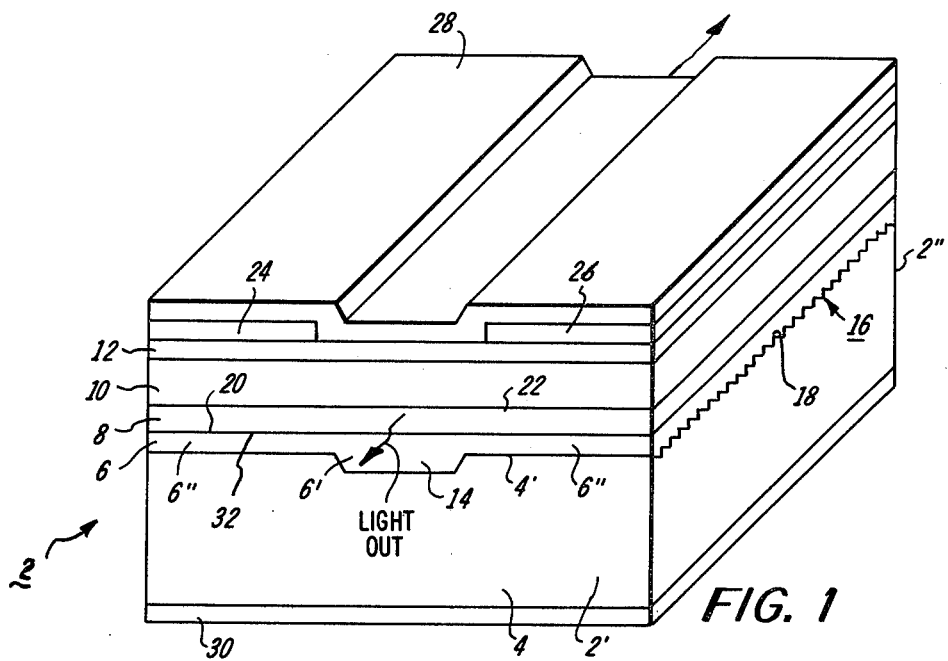
FIG. 1 is a schematic representation of a diode laser in accordance with the present invention.

Referring first to FIG. 1, there is shown an electrically pumped, double heterojunction, diode laser 2 in accordance with the invention. Basically, laser 2 consists of a substrate 4, a first waveguiding and carrier confining layer 6 on the upper surface of substrate 4, an active region layer 8, a second waveguiding and carrier confining layer 10, and a contact-facilitating layer 12. The upper surface 4' of substrate 4 contains a channel or groove 14 which extends from the near surface 2' of the laser to the far surface 2" of the laser. Channel 14 can be formed by the process described in U.S. Pat. No. 4,099,999. The portion 6' of the layer 6 is significantly thicker (at least two times thicker) than the remaining portions 6" of layer 6 due to portion 6' extending into channel 14.

Figure 2:
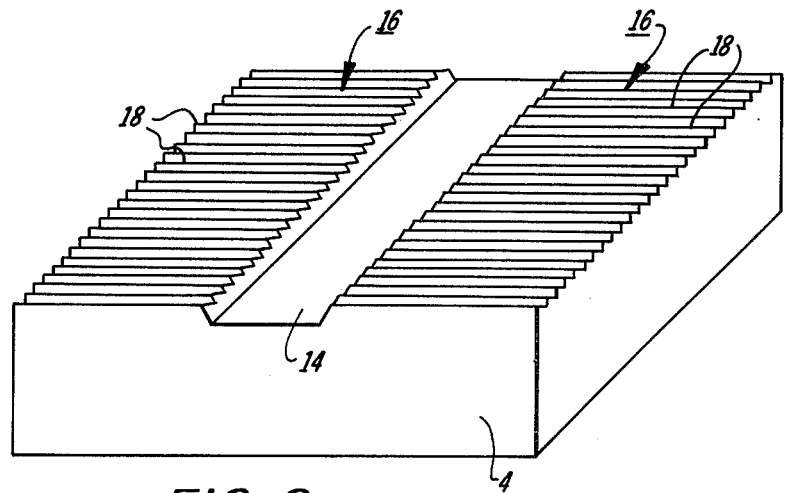
FIG. 2 shows a surface of the substrate of the laser of FIG. 1.

In addition to channel 14, upper surface 4' of substrate 4 contains a periodic structure 16, shown in the form of a grating having teeth or channels 18. As shown by FIG. 2, which depicts the substrate 4, the grating exists on both sides of channel 14, with teeth 18 extending in a direction transverse to the direction of channel 14. Periodic structure 16 can be formed by the methods described in U.S. Pat. No. 4,023,993. The spacing of the teeth 18 of periodic structure 16 depends upon the lasing wavelength in the active region layer 8, with such relationship being approximately given by the equation:

$$\Lambda = m\lambda/2n \tag{1}$$

where $\Lambda$ is the spacing of the periodic structure, m is the Bragg diffraction transverse mode order which is a small integer, lambda ($\lambda$) is the lasing wavelength in active region layer 8, and n is the refractive index of the active region layer 3. For a GaAs active region layer, lambda equals approximately 8,500Å and n is approximately 3.6 such that $\Lambda$ equals approximately 1,200Å for m equals 1, approximately 2,400Å for m equals 2, approximately 3,600Å for m equals 3, and so on for higher values of m.

Both layers 6 and 10 are of a material having a higher bandgap than the material of active region layer 8 whereby layers 6 and 10 will guide the light wave emission of active region layer 8. One of the layers 6 and 10 is doped to have a conductivity type different from that of layer 8 to provide a rectifying junction along one planar surface of active region layer 8. As is well known, when a forward bias is applied to the rectifying junction extending along the planar surface of active region layer 8, electrons are injected into layer 8 and are confined to layer 8 by the potential difference produced by the heterojunctions 20 and 22. With sufficient pump current population, inversion is achieved and light is produced by radiative recombination of the carriers in active region layer 8.

Substrate 4 is of a material having a bandgap lower than that of non-uniformly thick layer 6, with substrate 4 being of the same conductivity type as layer 6. Contact-facilitating layer 12 is of a material having a low bandgap and has the same conductivity type as layer 10. Layers of electrically insulating material 24 and 26 are provided over portions of layer 12 such that an electrode 28 contacts layer 12 only over a portion thereof in substantial vertical alignment with channel 14. Electrode 28 and electrode 30 on substrate 4 provide contacts for forward biasing the rectifying junction previously alluded to. Since electrode 28 contacts layer 12 only over the portion of layer 2 in vertical alignment with channel 14, pump current confinement is achieved and only the portion of layer 8 in substantial alignment with channel 14 receives pump current.

Specifically, substrate 4 can be n-type GaAs, layer 6 can be n-type $Ga_{0.5}Al_{0.5}As$, layer 8 can be p-type GaAs, layer 10 can be p-type $Ga_{0.6}Al_{0.4}As$, and layer 12 can be p-type GaAs. Such a structure would provide a rectifying junction 32 along the lower planar surface of active region layer 8, requiring a more positive voltage on electrode 28 for forward biasing junction 32.

As discussed in U.S. Pat. No. 4,023,993, the depth of teeth 18 of periodic structure 16 can be about 1250Å. Interaction between the light produced in active region layer 8 when rectifying junction 32 is forward biased to beyond threshold and grating 18 produces Bragg Scattering which reinforces and couples light traveling in layer 8 in the longitudinal direction (perpendicular to the direction of teeth 18) in a coherent manner such that the reflections are in phase. Such reinforcement provides single longitudinal mode laser emission without the need for discrete end reflectors or cleaved surfaces. Single longitudinal mode operation may be provided by making $m=1$ in equation (1), and since, as previously noted, lambda equals approximately 8,500Å for a GaAs active region and n is approximately 3.6 for GaAs A would equal approximately 1,200Å. Single longitudinal mode operation would also be achieved by making m of equation (1) equal to a larger integer.

As also discussed in U.S. Pat. No. 4,023,993, growth of layers, such as layer 6, on a substrate having a periodic structure such as 16 can be achieved in a conventional manner with conventional apparatus. As also noted in the referenced patent, it is, however, important that the growth be done at a low temperature, about 750 degrees Centrigrade, since high temperatures can cause a melt back or dissolution of the periodic structure. In this regard, a paper entitled "Liquid Phase Epitaxial Growth of $Ga_{1-x}Al_xAs$ On Channeled Substrates" appearing in *Journal of Crystal Growth* 45 (1978) 252–256, deals with growth morphology providing enhanced As diffusion into the channels of a periodic structure such as 16.

Figure 3:
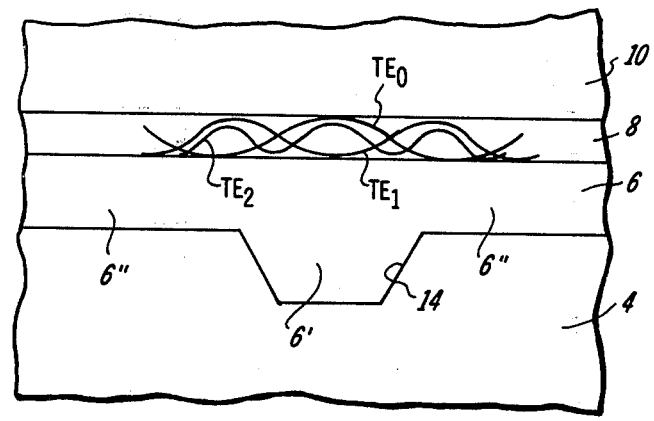
FIG. 3 shows some transverse mode energy distribution paterns of the laser of FIG. 1.

As is well known, the light produced by the laser 2 when rectifying junction 32 is forward biased beyond threshold might contain multiple, transverse modes, as well as the longitudinal mode previously discussed. However, the channel structure results in significant attenuation of all but the lowest order transverse mode due to the non-uniform thickness of layer 6. As shown in FIG. 3, the energy distribution of the lowest order transverse mode $TE_o$ is primarily over the thick portion 6' of layer 6 and thus that energy distribution is displaced significantly from substrate 4 which, due to its lower bandgap relative to layer 6, attenuates (or absorbs) light more readily than layer 6. Thus, the energy distribution of the lowest order transverse mode is not attenuated significantly by substrate 4. However, significant portions of the energy distributions of the higher order transverse modes, $TE_1$ and $TE_2$ of which are shown in FIG. 3, are over the thinner portions 6" of layer 6 and thus leak into the light attenuating substrate 4 whereby the higher order transverse modes are absorbed and thereby suppressed. As an example, using the specific compositions previously set forth for the layers and substrate of laser 2, portion 6' of layer 6 whould be at least two times thicker than portions 6" of layer 6. As specific examples, portion 6' can be 0.6–2.0 microns thick, with about 1.0 microns being preferred, and portions 6" can be 0.2–1.0 microns thick, with 0.4 microns being preferred.

Such thicknesses will provide sufficient optical interaction of the edges of the guided wave with periodic structure 16 for longitudinal mode control. Also, active region layer 8 should be between 0.1–0.3 microns thick and the width of channel 14 should be approximately 1 to 8 microns wide, with about 4 microns being preferred. The thicknesses of regions 6' and 6" of layer 6 and active region layer 8 for providing optimized transverse mode control depend on many design parameters, that is, the composition of layers 6, 8 and 10, the thickness of active region layer 8, the width of channel 14, and the doping and compositions of the various layers and the substrate, and those parameters must be taken into consideration in device fabrication. Layers 10 and 12 can be, for example, 2.0 and 0.5 microns thick, respectively, and substrate 4 can be 100 microns thick.

Fabrication of laser 2 proceeds by initially forming the periodic structure 16 on substrate 4 as taught by U.S. Pat. No. 4,023,993. Following formation of periodic structure 16, channel 14 is formed in the substrate surface containing the periodic structure by photolithographic masking and chemical etching techniques, for example, as taught by U.S. Pat. No. 4,099,999. If desired, channel 14 can be formed prior to periodic structure 16. The layers 6, 8, 10 and 12 can be grown by liquid phase epitaxy, molecular beam epitaxy, or chemical vapor deposition, or equivalent methods, the foregoing precautions regarding melt back being observed. Finally, contact 30 and pump current confining contact 28 are formed by conventional techniques to complete the structure of laser 2.

Materials other than GaAs can be used, such as materials containing In, Ga, Al, As, P, 5b, or any other known semiconductor material. We claim:

1. A solid state laser with mode control comprising:
  a semiconductor material substrate having a surface with a channel formed therein between plateau portions, said channel extending in a first direction;
  a periodic structure having sections formed only on said plateau portions, said periodic structure having peaks extending in a direction substantially transverse to said first direction;
  a non-uniformly thick cladding layer supported by said substrate and filling said channel and covering the sections of said periodic structure;
  a plurality of tandomly disposed semiconductor material layers supported by said cladding layer, one of said plurality of layers being an active region layer of substantially uniform composition;
  said plurality of layers being doped to provide a rectifying junction adjacent said active region layer; and
  electrode means for the application of forward bias to said rectifying junction to provide pump current to said active region layer for the production, upon sufficient forward bias, of radiant energy; and
  said radiant energy interacting with said periodic structure and said cladding layer to provide mode controlled laser emission.

* * * * *